United States Patent
Shiang et al.

(10) Patent No.: US 7,910,386 B2
(45) Date of Patent: Mar. 22, 2011

(54) METHOD OF MAKING ORGANIC LIGHT EMITTING DEVICES

(75) Inventors: Joseph John Shiang, Niskayuna, NY (US); Kevin Henry Janora, Schenectady, NY (US); Gautam Parthasarathy, Saratoga Springs, NY (US); James Anthony Cella, Clifton Park, NY (US); Kelly Scott Chichak, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1134 days.

(21) Appl. No.: 11/637,582

(22) Filed: Dec. 12, 2006

(65) Prior Publication Data

US 2008/0026496 A1 Jan. 31, 2008

Related U.S. Application Data

(60) Provisional application No. 60/833,935, filed on Jul. 28, 2006.

(51) Int. Cl.
*H01L 29/72* (2006.01)
(52) U.S. Cl. ............ 438/22; 438/795; 427/66; 428/413; 428/690; 257/40; 257/79
(58) Field of Classification Search .............. 438/22, 438/795; 428/413, 690; 427/66; 257/40, 257/79
See application file for complete search history.

(56) References Cited

U.S. PATENT DOCUMENTS

2005/0249975 A1* 11/2005 Sandberg et al. ............. 428/690
2006/0029811 A1* 2/2006 Sugioka et al. ............... 428/413

FOREIGN PATENT DOCUMENTS

| EP | 1834956 A1 | 9/2007 |
| JP | 09-164772 | 6/1997 |
| WO | WO2006073112 A | 7/2006 |

OTHER PUBLICATIONS

PCT International Search Report dated Jan. 15, 2008.
Yong Cao et al., "Efficient, Fast Response Light-Emitting Electrochemical Cells: Electroluminescent and Solid Electrolyte Polymers With Interpenetrating Network Morphology", Appl. Phys. Lett., vol. 68, No. 23, pp. 3218-3220, Jun. 3, 1996.

* cited by examiner

*Primary Examiner* — Edward Wojciechowicz
(74) *Attorney, Agent, or Firm* — Mary Louis Gioeni

(57) ABSTRACT

The present invention provides a method for the preparation of organic light-emitting devices comprising a bilayer structure made by forming a first film layer comprising an electroactive material and an INP precursor material, and exposing the first film layer to a radiation source under an inert atmosphere to generate an interpenetrating network polymer composition comprising the electroactive material. At least one additional layer is disposed on the reacted first film layer to complete the bilayer structure. The bilayer structure is comprised within an organic light-emitting device comprising standard features such as electrodes and optionally one or more additional layers serving as a bipolar emission layer, a hole injection layer, an electron injection layer, an electron transport layer, a hole transport layer, exciton-hole transporting layer, exciton-electron transporting layer, a hole transporting emission layer, or an electron transporting emission layer.

22 Claims, No Drawings

METHOD OF MAKING ORGANIC LIGHT EMITTING DEVICES

CROSS-REFERENCE TO RELATED APPLICATIONS

This application claims priority to currently pending U.S. Provisional Application Ser. No. 60/833,935, filed Jul. 28, 2006, which is incorporated herein by reference.

STATEMENT REGARDING FEDERALLY SPONSORED RESEARCH & DEVELOPMENT

This invention was made with Government support under contract number DEFC2605NT42343 awarded by Department of Energy. The Government has certain rights in the invention.

BACKGROUND

The invention includes embodiments that relate to a method of making an organic light-emitting device. The invention also includes embodiments that relate to an organic light-emitting device.

An organic light-emitting device (OLED) is typically a thin film structure formed on a substrate such as glass or transparent plastic. A light-emitting layer (emissive layer) of an organic electroluminescent material and optional adjacent semiconductor layers are sandwiched between a cathode and an anode to form a multi-layered device. The semiconductor layers may be either hole (positive charge)—injecting or electron (negative charge)—injecting layers and also comprise organic materials. The light emitting organic layer may itself consist of multiple sublayers, each comprising a different organic electroluminescent material. Upon application of an appropriate voltage to the OLED, the injected positive and negative charges recombine in the emissive layer to produce light.

The fabrication of a multilayered device comprising organic materials has been problematic using methods involving solvents. This is because of dissolution of underlying layers in solutions employed for disposing the succeeding layers. Further, even if the coating compositions do not dissolve the underlying layer, it is often difficult to achieve continuous and coalesced film coverage. Crosslinked organic materials may be used to circumvent this problem. However, organic layers in multilayer organic light emitting devices are typically cross-linked by heating at temperatures above 130 degrees Celsius. In many instances, light emissive materials used in OLEDs cannot be heated to temperatures above 130 degrees Celsius as photoluminescence yield of theses materials may be reduced following such treatment.

Therefore a method of making a multilayered organic light-emitting device having enhanced structural integrity is greatly desired. Moreover, multilayered organic light emitting devices having enhanced structural integrity are also desired.

BRIEF DESCRIPTION

In one embodiment, the present invention provides a method of making an organic light-emitting device comprising at least one bilayer structure. The method comprises providing at least one first layer comprising an electroactive material and an "INP" precursor material ("interpenetrating network polymer" precursor material); exposing the first layer while in contact with an inert atmosphere to a radiation source to afford a reacted first layer comprising an interpenetrating network polymer composition; disposing at least one second layer on the reacted first layer to afford a bilayer structure.

In a second embodiment, the present invention provides a method of making an organic light-emitting device comprising at least one bilayer structure, said method comprising: providing a first layer comprising an electroluminescent polymer, and an INP precursor material; exposing the first layer while in contact with an inert atmosphere to a radiation source to afford a reacted first layer comprising an interpenetrating network polymer composition; and disposing at least one second layer on the reacted layer; to afford a bilayer structure.

In a third embodiment, the present invention provides a method of preparing an organic light-emitting device comprising at least one bilayer structure, said method comprising disposing a first layer comprising an electroactive material, and an INP precursor material onto a substrate comprising a first electrode; exposing the first layer while in contact with an inert atmosphere to a radiation source to afford a reacted first layer comprising an interpenetrating network polymer composition; and disposing at least one second layer on the reacted first layer to afford a bilayer structure; and disposing a second electrode on an assembly comprising the bilayer structure.

DETAILED DESCRIPTION

In the following specification and the claims, which follow, reference will be made to a number of terms, which shall be defined to have the following meanings.

The singular forms "a", "an" and "the" include plural referents unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", are not to be limited to the precise value specified. In some instances, the approximating language may correspond to the precision of an instrument for measuring the value.

As noted, in one embodiment the present invention provides a method of making an organic light-emitting device (OLED) comprising at least one bilayer structure. The method comprises providing a first layer comprising an electroactive material, and an interpenetrating network polymer precursor material (INP precursor material); exposing the first layer while in contact with an inert atmosphere to a radiation source to afford a reacted first layer comprising an interpenetrating network polymer composition; and disposing at least one second layer on the reacted first layer. The method affords a bilayer structure having an enhanced structural integrity relative to the corresponding bilayer structure formed without the use of an INP precursor material. In addition, because the interpenetrating network polymer composition is generated under an inert atmosphere, other performance characteristics of the product organic light-emitting device, for example electroluminescent efficiency, are enhanced as well.

The first layer comprises an electroactive material and an INP precursor material. As used herein, the term "electroactive material" refers to organic materials which may be polymeric or non-polymeric, and which are susceptible to charge conduction when subjected to a voltage bias, for example organic materials which conduct electrons and/or holes in an organic light emitting device (OLED). Electroactive materials include, for example, organic semiconducting polymers. Those skilled in the art will appreciate that while electroluminescent materials represent a class of electroactive materials, a material need not be electroluminescent to be electroactive.

As noted, the first layer comprises an electroactive material, and an INP precursor material. The first layer when exposed to a radiation source in the presence of an inert atmosphere is converted to a reacted first layer as functional groups present in the interpenetrating network polymer precursor (INP precursor material) react under the stimulus of the radiation source. In one embodiment, the reacted first layer comprises a non-polymeric electroactive material as a component in an interpenetrating network polymer composition. In an alternate embodiment, the reacted first layer comprises a polymeric electroactive material as a component in an interpenetrating network polymer composition. There is no requirement that the electroactive material be covalently bound to the network polymer derived from the INP precursor material, although the electroactive material may, in certain embodiments be covalently bound to the network polymer.

The reacted first layer may perform a variety of functions during operation of the organic light-emitting device comprising it. For example, the reacted first layer may serve as an electroluminescent layer, at times referred to as a "bipolar emission layer". A bipolar emission layer is a layer within an organic light emitting device which when in operation contains a significant concentration of both electrons and holes and provides sites for exciton formation and light emission. Alternate functions of the reacted first layer in an organic light-emitting device include: a "hole injection layer" which is defined as a layer in contact with the anode which promotes the injection of holes from the anode into the interior layers of the OLED; an "electron injection layer" which is defined as a layer in contact with the cathode that promotes the injection of electrons from the cathode into the OLED; and an "electron transport layer" which is defined as a layer which facilitates conduction of electrons from cathode to a charge recombination site. The electron transport layer need not be in contact with the cathode, and frequently the electron transport layer is not an efficient hole transporter and thus it serves to block holes migrating toward the cathode. During operation of an organic light emitting device comprising an electron transport layer, the majority of charge carriers (i.e. holes and electrons) present in the electron transport layer are electrons and light emission can occur through recombination of holes and electrons present in the electron transport layer. Additional functions of the reacted first layer include serving as a "hole transport layer" which is defined as a layer which when the OLED is in operation facilitates conduction of holes from the anode to charge recombination sites and which need not be in contact with the anode; and serving as an "exciton-hole transporting layer" which is defined as a layer which when the OLED is in operation facilitates the conduction of holes from the anode to charge recombination sites, and in which the majority of charge carriers are holes, and further in which excitons, typically triplet excitons, are also present and mobile, but do not emit light. The reacted first layer may serve as an "exciton-electron transporting layer" which is defined as a layer which when the OLED is in operation facilitates the conduction of electrons from the cathode to charge recombination sites, and in which the majority of charge carriers are electrons, and in which excitons, typically triplet excitons, are present and mobile, but do not emit light. Additionally, the reacted first layer may serve as a "hole transporting emission layer" which is defined as a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. In some embodiments the reacted first layer serves as an "electron transporting emission layer" which is defined as a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

In one embodiment, the first layer and the reacted first layer comprise an electroactive material which is light emissive. As noted, a layer in an organic light-emitting device which emits light under an applied electrical bias may be referred to as an electroluminescent layer and is at times herein referred to as a "bipolar emission layer". In this and other embodiments, the electroluminescent layer is the locus of combination of holes and electrons to provide light-emissive excited state species which emit electromagnetic radiation, typically in the visible range. Electroactive organic materials that are light emissive may be selected to electroluminesce in the desired wavelength range.

In one embodiment, the first layer and the reacted first layer comprise a light emissive polymer. Suitable light emissive polymers which may be employed include, but are not limited to, poly(N-vinylcarbazole) ("PVK", emitting violet-to-blue light in the wavelengths of about 380-500 nanometers) and its derivatives; polyfluorene (410-550 nanometers) and its derivatives; poly(para-phenylene) (400-550 nanometers) and its derivatives; poly(p-phenylene vinylene); poly(pyridine vinylene); polyquinoxaline; polyquinoline, polysilanes, and copolymers thereof.

In one embodiment, the electroactive material is selected from the group consisting of poly(N-vinylcarbazole), polyfluorenes, poly(para-phenylenes), poly(p-phenylene vinylenes), poly(pyridine vinylenes), polyquinoxalines, polyquinolines, polysilanes, copolymers thereof, and combinations thereof.

Further examples of suitable light emissive organic materials include derivatives of polyfluorene such as poly(alkylfluorene), for example poly(9,9-dihexylfluorene), poly(9,9-dioctylfluorene), and poly{9,9-bis(3,6-dioxaheptyl)-fluorene-2,7-diyl}; derivatives of poly(para-phenylene) (PPP) such as poly(2-decyloxy-1,4-phenylene) and poly(2,5-diheptyl-1,4-phenylene); poly(p-phenylene vinylene) (PPV), derivatives such as dialkoxy-substituted PPV, and cyano-substituted PPV; derivatives of polythiophene such as poly(3-alkylthiophene), poly(4,4'-dialkyl-2,2'-bithiophene), and poly(2,5-thienylene vinylene); derivatives of poly(pyridine vinylene); derivatives of polyquinoxaline; and derivatives of polyquinoline. In one particular embodiment a suitable light emitting material is poly(9,9-dioctylfluorenyl-2,7-diyl) end capped with N,N-bis(4-methylphenyl)-4-aniline. Mixtures of polymers and/or copolymers may also be used to tune the color of emitted light, for example.

As noted, another class of suitable organic materials which may be employed as an electroactive light emissive material in the first layer are polysilanes. Typically, polysilanes are linear silicon-backbone polymers substituted with a variety of alkyl and/or aryl groups. Polysilanes are quasi one-dimensional materials with delocalized sigma-conjugated electrons along polymer backbone. Examples of suitable polysilanes include, but are not limited to, poly(di-n-butylsilane), poly (di-n-pentylsilane), poly(di-n-hexylsilane), poly(methylphenylsilane), and poly{bis(p-butylphenyl)silane}.

In certain embodiments, the electroactive material employed in the first layer is an organic electroactive material having a weight average molecular weight less than about 5000 grams per mole and comprising one or more aromatic radicals. Such low molecular weight organic electroactive materials are in various embodiments applicable as light emissive materials. An example of such materials is 1,3,5-tris{N-(4-diphenylaminophenyl) phenylamino}benzene, which emits light in the wavelength range of from about 380 to about 500 nanometers. In various embodiments the present invention provides a light emissive reacted first layer which may comprise still lower molecular weight organic molecules, such as phenylanthracene, tetraarylethene, coumarin, rubrene, tetraphenylbutadiene, anthracene, perylene, coronene, their derivatives, or a combination of two or more of the foregoing. These materials generally emit light having maximum wavelength of about 520 nanometers. Still other advantageous materials which may serve as the electroactive material in the first layer and the reacted first layer are the low molecular-weight metal organic complexes such as aluminum-, gallium-, and indium-acetylacetonate, which emit light in the wavelength range of from about 415 to about 457 nanometers. Suitable electroactive aluminum compounds include aluminum-(picolymethylketone)-bis{2,6-di(t-butyl)phenoxide}. In addition, scandium-(4-methoxy-picolylmethylketone)-bis(acetylacetonate), which emits in the wavelength range of from about 420 to about 433 nanometers may be employed as the electroactive material. In certain embodiments, for example white light applications, the electroactive material employed in the first layer and the reacted first layer is a light emissive organic materials that emits light in the blue-green wavelength range.

The INP precursor material is typically a polyfunctional organic material which may be reacted to form an interpenetrating network structure. Suitable INP precursor materials comprise at least one photoreactive functional group. The photoreactive functional groups are activated (i.e. caused to react) upon exposure to a radiation source. As used herein, the term radiation source includes a source of electromagnetic radiation, a source of charged particles such an electron-beam, or a combination thereof. In one embodiment, the electromagnetic radiation has a wavelength in the range from about 1 nm to about 2500 nm.

In one embodiment, the INP precursor material comprises a photoreactive functional group selected from the group consisting of an acrylate group, a methacrylate group, an epoxy group, an olefinic group, a urethane group, a vinyl ether group, or a combination thereof.

In one embodiment, the INP precursor material comprises a poly-acrylated compound, a poly-methacryalted compound, a poly-epoxide compound, a vinyl aromatic compound, a poly-carbamoylated compound, a polyvinyl ether compound, a trialkoxysilane, an organic orthosilicate, or a combination of two or more of the foregoing. Poly-acrylated compounds which may serve as INP precursor materials comprise at least two acrylate functional groups within the same molecule. Similarly poly-methacrylated compounds which may serve as the INP precursor material comprise at least two methacrylate groups.

Poly-acrylated compounds and poly-methacrylated compounds fall within a larger group of compounds referred to at times simply as "acrylated" INP precursor materials. "Acrylated" INP precursor materials comprise at least one acrylate or methacrylate functional groups. Suitable acrylated INP precursor materials include NORLAND 68 OPTICAL ADHESIVE available from Norland Products, Inc; SR454 (3 mole ethoxylated trimethylolpropane triacrylate), SR368D (tris(2-hydroxyethyl) isocyanurate triacrylate), SR502, and SR295 (pentaerythritol tetraacrylate). In certain embodiments a the INP precursor material comprises a photoinitiator, for example Sarcure SR1130. A wide variety of photoinitiators are known in the art, for example benzophenone, 2-hydroxy-2-methyl-1-phenyl-1-propanone (BENACURE 1173), anisoin, benzil, camphorquinone, and the like. SR454, SR368D, SR502, SR295, and the photoinitiator Sarcure SR1130 are available from the Sartomer Company, Inc. In one embodiment, the INP precursor comprises a tri-acrylated compound having structure I.

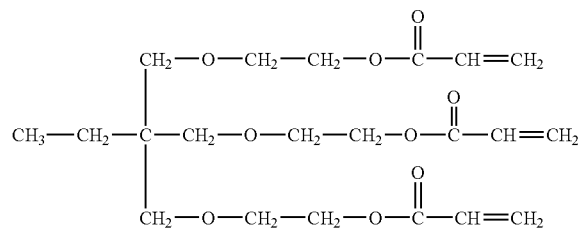

In one embodiment, the first layer comprises the electroactive material in an amount corresponding to from about 0.1 weight percent to about 50 weight percent of the total weight of the first layer. In another embodiment, the first layer comprises the electroactive material in an amount corresponding to from about 5 weight percent to about 45 weight percent of the total weight of the first layer. In an alternate embodiment, the first layer comprises the electroactive material in an amount corresponding to from about 10 weight percent to about 35 weight percent of the total weight of the first layer.

In one embodiment, the first layer comprises the INP precursor material in an amount corresponding to from about 99.9 weight percent to about 10 weight percent of the total weight of the first layer. In another embodiment, the first layer comprises the INP precursor material in an amount corresponding to from about 95 weight percent to about 55 weight percent of the total weight of the first layer. In an alternate embodiment, the first layer comprises the INP precursor material in an amount corresponding to from about 90 weight percent to about 65 weight percent of the total weight of the first layer.

In one embodiment, the first layer is provided using a method comprising coating, extrusion, lithographic printing, Langmuir processing, flash evaporation, sputtering, vapor deposition or a combination of two or more of the foregoing techniques. Suitable coating methods include, but are not limited to, spin coating, dip coating, reverse roll coating, wire-wound or Mayer rod coating, direct gravure coating, offset gravure coating, slot die coating, blade coating, hot melt coating, curtain coating, knife over roll coating, extrusion, air knife coating, spray, rotary screen coating, multi-layer slide coating, meniscus coating, comma coating, and microgravure coating. Suitable vapor deposition methods include, but are not limited to, plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), electron-cyclotron-resonance plasma-enhanced chemical-vapor deposition ("ECRPECVD"), or inductively coupled plasma-enhanced chemical-vapor deposition ("ICPECVD"). Suitable sputtering methods include, but are not limited to reactive sputtering.

In one embodiment, the first layer is provided by spin-coating. Thus, in one embodiment, a solution comprising an INP precursor material and an electroactive material in the desired amount is prepared and spin-coated onto a surface (for example an electrode surface) to provide the first layer. Any suitable solvent may be used to prepare the solution of INP precursor material and the electroactive material. In general, suitable solvents are those solvents and solvent combinations capable of dissolving the INP precursor material and the electroactive material. Suitable solvents include hydrocarbons such as o-xylene, m-xylene, p-xylene, toluene, hexanes, like solvents, and combinations of two or more of the foregoing solvents. A solution comprising the INP precursor material and the electroactive material may be prepared, for example, by combining the INP precursor material, the electroactive material and the solvent in vessel and subjecting the mixture to stirring, ultrasonication, or other known method which is effective in the preparation of a solution.

In one embodiment, the first layer has a thickness in a range from about 10 nanometers to about 1000 nanometers. In another embodiment, the first layer has a thickness in a range from about 30 nanometers to about 600 nanometers. In yet another embodiment, the first layer has a thickness in a range from about 60 nanometers to about 300 nanometers.

As noted, the method for making the organic light-emitting device comprises exposing the first layer while in contact with an inert atmosphere to a radiation source to afford a reacted first layer comprising an interpenetrating network polymer composition. In one embodiment, the radiation source is selected from the group consisting of ultra-violet radiation sources, gamma radiation sources, plasma radiation sources, electron-beam sources, and combinations thereof. In a particular embodiment, the method for making the organic light-emitting device comprises exposing the first layer to an ultra violet radiation source.

As noted, exposing the first layer to a radiation source is conducted while the first layer is in contact with an inert atmosphere. Thus, air, and non-inert components of air, such as oxygen, are excluded during irradiation of the first layer. Air is comprised chiefly of the relatively inert gas nitrogen (78%), but comprises a substantial amount of oxygen (21%) and water vapor which are regarded as non-inert components of air. The amount of water vapor present may vary widely depending upon the weather and other environmental conditions. Exclusion of air and non-inert components of air during the irradiation step need not be absolute, but exclusion of air and non-inert components of air should be maintained to a degree such that performance of the product organic light-emitting device is not negatively affected. As is disclosed in the Examples provided herein, various performance characteristics of the organic light-emitting device suffer if the first layer is exposed to a radiation source under ambient atmospheric conditions. In one embodiment, the irradiation step is carried out while the first layer is in contact with an inert atmosphere comprising less than about 20 by volume air. In an alternate embodiment, the irradiation step is carried out while the first layer is in contact with an inert atmosphere comprising less than about 5 by volume air. In yet another embodiment, the irradiation step is carried out while the first layer is in contact with an inert atmosphere comprising less than about 1 by volume air. Suitable inert atmospheres are comprised chiefly of inert gases such as nitrogen, argon, and mixtures thereof. In certain embodiments an argon atmosphere is preferred.

The method of the present invention for making the organic light-emitting device comprises disposing a second layer on the reacted first layer. The second layer may be any layer useful in an organic light-emitting device. Thus the second layer, although distinct from the reacted first layer, may be any one of the various types of layers illustrated for the reacted first layer. For example, the second layer may serve as an electroluminescent layer, at times referred to as a "bipolar emission layer". Alternate functions of the second layer in an organic light-emitting device include: a "hole injection layer"; an "electron injection layer"; and an "electron transport layer". Additional functions of the second layer include serving as a "hole transport layer"; and serving as an "exciton-hole transporting layer". The second layer may serve as an "exciton-electron transporting layer". Additionally, the second layer may serve as a "hole transporting emission layer". In some embodiments the second layer serves as an "electron transporting emission layer".

In one embodiment, the second layer comprises at least one electroactive material selected from the group consisting of a hole injection material, a hole transport material, a hole blocking material, an electron injection material, and an electron transport material.

In one embodiment, the second layer is a bipolar emissive layer. In another embodiment, the second layer is a hole injection layer. In yet another embodiment, the second layer is an exciton-electron transporting layer.

Electroactive materials suitable for use in a bipolar emission layer are illustrated by electroluminescent materials generally, for example poly(9,9-dioctyl flourene), and F8-TFB copolymer.

Electroactive materials suitable for use in a hole injection layer are illustrated by BAYTRON commercially available from H.C. Stark, Inc. and hole injection layer (HIL) materials available from Air Products.

Electroactive materials suitable for use in an electron injection layer are illustrated by lithium fluoride (LiF), cesium fluoride (CsF), and reaction products thereof with other components of the organic light-emitting device. Organic materials suitable for use in an electron injection layer include metal organic complexes, oxadiazole derivatives, perylene derivatives, pyridine derivatives, pyrimidine derivatives, quinoline derivatives, quinoxaline derivatives, diphenylquinone derivatives, poly(fluorine) derivatives, and like materials.

Electroactive materials suitable for use in an electron transport layer are illustrated by poly(9,9-dioctyl fluorene); tris(8-hydroxyquinolato) aluminum ($Alq_3$); 2,9-dimethyl-4,7-diphenyl-1,1-phenanthroline; 4,7-diphenyl-1,10-phenanthroline; 2-(4-biphenylyl)-5-(4-t-butylphenyl)-1,3,4-oxadiazole; and 3-(4-biphenylyl)-4-phenyl-5-(4-t-butylphenyl)-1,2,4-triazole.

Electroactive materials suitable for use in a hole transport layer are illustrated by 1,1-bis((di-4-tolyl amino) phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino)benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylendioxythiophene) (PEDOT), polyaniline, and the like.

Electroactive materials suitable for use in an exciton-hole transporting layer are illustrated by F8-TFB copolymer.

Electroactive materials generally, may serve as materials which support an exciton-electron transporting function, a hole transporting emission function, or an electron transporting emission function.

As noted, the method of making the organic light-emitting device comprises disposing a second layer on the reacted first layer, the first reacted layer comprising an interpenetrating network polymer composition. In one embodiment, the method of disposing the second layer on the reacted first layer comprises exposing said reacted first layer to a solvent, for example by applying the second layer to the reacted first layer by contacting the reacted first layer with a solution comprising a solvent and an electroactive material using a technique such as solvent-casting, spin-coating, dip coating, spray coating, blade coating, or a combination of two or more of the foregoing techniques.

Exposing the reacted first layer to a solvent during the application of the second layer results in the reacted first layer being in contact with the solvent for a period of time, sometimes referred to herein as the contact time. The contact time of the solvent with the reacted first layer may vary depending upon the method of disposing the second layer employed. Thus, the contact time of the solvent with the reacted first layer may be on the order of a few seconds, for example, when the second-layer is disposed on the reacted first by spin-coating. In the alternative, the contact time of the solvent with the reacted first layer may be on the order of a few hours, for example, when the second-layer is disposed on the reacted first layer by solution-casting. In one specific embodiment, the method of disposing the second layer on the reacted first layer comprises spin-coating.

The solvent employed in disposing the second layer on the reacted first layer may be a polar or a non polar solvent and may comprise one or more suitable solvent components, for example a solvent comprising as solvent components toluene and xylenes. In one embodiment, para-xylene is used as a solvent to dispose the second layer on the reacted first layer.

As noted, the present invention provides a method for making an organic-light emitting device comprising a bilayer structure having a reacted first layer such that the bilayer structure has enhanced characteristics relative to a corresponding bilayer structure prepared by other methods. For example, as is demonstrated in the Examples provided herein, the formation of the interpenetrating network polymer composition of the reacted first layer imparts solvent resistance to the reacted first layer. Solvent resistance of the reacted first layer is especially advantageous when the second layer is to be disposed upon the reacted first layer using a technique employing a solvent, for example spin coating the second layer onto the reacted first layer. The term solvent resistance includes non-dissolution and/or non-disintegration of the reacted first layer upon exposure to the solvent used for disposing the second layer.

A second important limitation is that the first layer comprising an electroactive material and an INP precursor material be exposed to a radiation source while in contact with an inert atmosphere. As is demonstrated by the Examples provided herein, loss of performance characteristics such as fluorescence quantum efficiency, results when the first layer is irradiated in the presence of air to provide the reacted first layer and is retained when the irradiation step is carried out under an inert atmosphere.

In one embodiment, the bilayer structure of the present invention comprises a reacted first layer that is a bipolar emissive layer and a second layer that is an hole injection layer.

In another alternative embodiment, the bilayer structure of the present invention comprises a reacted first layer that is a hole injection layer and a second layer that is a light emissive layer.

It is also possible that the bilayer structure may comprise more than one electroluminescent layer formed successively, one on top of another. Each layer may have a different electroluminescent material that may emit in different wavelength ranges. Thus, in one embodiment, the bilayer structure of the present invention comprises a reacted first layer that is a light emissive layer and a second layer that is also a light emissive layer, each of said layers comprising an electroluminescent material. The second layer may comprise an electroluminescent organic material that may be different from that of the first layer.

The organic light emitting device may further comprise one or more electroactive layers in addition to the layers comprising the bilayer structure. These additional layers may comprise one or more electroactive materials and serve a variety of functions. Thus, the additional layer(s) may serve as a bipolar emission layer, a hole injection layer, an electron injection layer, an electron transport layer, a hole transport layer, exciton-hole transporting layer, exciton-electron transporting layer, a hole transporting emission layer, or an electron transporting emission layer.

The organic light emitting device may further include a substrate layer such as but not limited to polymeric substrates. Non limiting examples of substrates include thermoplastic polymers, for example poly(ethylene terephthalate), poly (ethylene naphthalate), polyethersulfones, polycarbonates, polyimides, polyetherimides, polyacrylates, and polyolefins; glass; metal; like materials; and combinations thereof.

The organic light emitting device provided by the present invention comprise includes conductive layers such as a cathode layer and an anode layer.

A cathode layer serves the purpose of injecting negative charge carriers (electrons) into the electro-active organic layer. Suitable cathode materials for organic light emitting devices typically include materials having low work function value. Non-limiting examples of suitable cathode materials include materials such as K, Li, Na, Mg, Ca, Sr, Ba, Al, Ag, Au, In, Sn, Zn, Zr, Sc, Y, Mn, Pb, elements of the lanthanide series, metal alloys (particularly Ag—Mg alloy, Al—Li alloy, In—Mg alloy, Al—Ca alloy, and Li—Al alloy), and mixtures thereof. Other examples of suitable cathode component materials may include alkali metal fluorides, alkaline earth fluorides, and mixtures of metal fluorides. Indium tin oxide, tin oxide, indium oxide, zinc oxide, indium zinc oxide, zinc indium tin oxide, antimony oxide, carbon nanotubes, and mixtures of two or more of the foregoing are also suitable cathode materials. In one embodiment, the cathode comprises at least two layers. A cathode having two layers is at times referred to as a bilayer cathode. Non-limiting examples of bilayer cathodes are illustrated by cathodes having an inner layer comprising LiF or NaF and an outer layer of aluminum or silver, and cathodes having an inner layer of calcium and an outer layer of aluminum or silver. Bilayer cathodes comprising a metal fluoride are believed to exhibit enhanced electron injection relative to the corresponding monolayer cathode lacking the metal fluoride.

An anode layer serves the purpose of injecting positive charge carriers (holes) into the electro-active organic layer. Suitable anode materials for electro-active devices typically include those having a high work function value. In one embodiment, the anode comprises a conductive film with a sheet resistance less than 500 Ohm/square. In an alternate embodiment, the anode comprises a material having a bulk conductivity of at least 100 siemens per centimeter, as measured by a four-point probe technique. Non-limiting examples of anode materials include, but are not limited to, indium tin oxide (ITO), tin oxide, indium oxide, zinc oxide, indium zinc oxide, nickel, gold, like materials, and mixtures thereof. Indium tin oxide (ITO) is typically used for this purpose because it is substantially transparent to light transmission and thus enables light emitted from electro-active organic layer to escape through the ITO anode layer without being significantly attenuated. The term "transparent" means allowing at least 50 percent, commonly at least 80 percent, and more commonly at least 90 percent, of incident light in the visible wavelength range having an angle of incidence of less than about 10 degrees to be transmitted.

Typically, during fabrication the anode and cathode layers are deposited on an underlying layer(s) by physical vapor deposition, chemical vapor deposition, sputtering, or other process known to those skilled in the art. The thickness of cathode and anode layers may vary independently but are generally in the range from about 10 nanometers to about 500 nanometers in an embodiment, from about 10 nanometers to about 200 nanometers in another embodiment, and from about 50 nanometers to about 200 nanometers in still another embodiment.

In one embodiment, the organic light-emitting device can further comprise one or more photoluminescent ("PL") layers, having at least a fluorescent layer and/or a phosphorescent layer, such as, for example those disclosed in U.S. Pat. No. 6,847,162.

Organic light emitting devices provided by the present invention may include additional layers such as, but not limited to, one or more of an abrasion resistant layer, an adhesion layer, a chemically resistant layer, a photoluminescent layer, a radiation-absorbing layer, a radiation reflective layer, a barrier layer, a planarizing layer, optical diffusing layer, and combinations thereof.

In some embodiments, the method of making the organic light emitting device of the present invention includes providing a substrate and disposing at least one bilayer structure over the substrate, wherein the bilayer structure layer comprises a reacted first layer and a second layer. In certain embodiments, the substrate is an electrode and may be a cathode or an anode. The electrode substrate may include, in addition to the electrode material itself, one or more other substrate materials such the polymeric, glass and metal substrates listed hereinabove.

In one embodiment, the method comprises disposing over the substrate one or more electroactive layers, for example a bipolar emission layer, a hole injection layer, or hole transport layer, prior to providing the first layer. In such instances, a multilayer structure may be constructed and the first layer comprising an electroactive material, and an INP precursor material is disposed upon the multilayer structure. In some embodiments, the bilayer structure is in direct contact with the substrate.

In one embodiment, the present invention provides an organic light-emitting device comprising at least one bilayer structure. The bilayer structure comprises a reacted first layer comprising an interpenetrating network polymer composition, said interpenetrating network polymer composition comprising an electroactive material and the reaction product of a INP precursor material; and a second layer disposed on the reacted first layer.

EXAMPLES

Materials: In the following examples poly(3,4-ethylenedioxythiophene) (PEDOT) was obtained from Stark and TFB was obtained from Dow Sumitomo Chemicals. Details about TFB (also referred to herein as F8TFB may be found in U.S. Patent Application 20050014926 paragraphs [0043] and [0062]-[0069] of which are incorporated herein by reference. The INP precursor material NORLAND 68 OPTICAL ADHESIVE was obtained from Norland Products, Inc. The INP precursor materials SR454 (3 mole ethoxylated trimethylolpropane triacrylate), SR368D (tris(2-hydroxyethyl) isocyanurate triacrylate), SR502, SR295 (pentaerythritol tetraacrylate) and the photoinitiator Sarcure SR1130 were obtained from the Sartomer Company, Inc. SR454 SR-368D and SR-502 are at times referred to herein as "Sartomer monomers".

Film Solubility and Air Sensitivity

General Methods: The formation of an interpenetrating network polymer comprising the electroactive material and the product resulting from exposure to a radiation source of a mixture of the electroactive material and the INP precursor material was demonstrated as follows. A solution of an electroactive material and the INP precursor material were spun onto 2.5 cm×2.5 cm substrates cut from FISHERBRAND glass microscope slides to form a first film layer. The glass substrate had been cleaned beforehand by wiping with an isopropanol-soaked KIMWIPE EX-L laboratory wipe followed by rinsing with isopropanol. The clean substrates were then blown dry with nitrogen and mounted on a spinning stage. Spin conditions used for depositing the first film layer of the electroactive material and the INP precursor material onto the glass substrate were typically about 3000 rpm for about 30 seconds to generate a film having a thickness in a range from about 40 to about 80 nm. After exposure to UV curing conditions, the optical density (OD) of the film-glass slide combination was measured on a Hewlett-Packard HP8450A U/VIS spectrophotometer. The optical density was defined as the optical absorbance of the film-glass slide combination after exposure to UV curing conditions corrected for the optical absorbance of a blank glass slide reference. The OD was measured at an absorbance peak associated with the electroactive material. These absorbance peaks associated with the electroactive material were typically at wavelengths in a range from about 340 nm to about 390 nm.

The film-glass slide combination was then replaced onto the spinning stage and the film was completely covered with a pool of m-xylene to dissolve soluble components of the film. After allowing 20 seconds for dissolution, the spinner was then activated (3500 rpm, 30 seconds) to remove the m-xylene and soluble film components and to dry the undissolved-film-glass slide combination. The OD of the undissolved-film-glass slide combination following this rinse treatment with m-xylene was then measured on the UV/VIS spectrophotometer and a percentage loss due to the rinse was calculated. A second and third rinse was carried out on selected samples. The data revealed that most of the OD losses occurred as a result of the first rinse; and that the second and third rinses typically resulted in either no loss in optical density, or a loss in optical density of less than about 3 percent.

Measurement of Relative Fluorescence Quantum Efficiency ($QE_{rel}$):

The UV curing of film layers comprising an electroluminescent material and an INP precursor material were further evaluated in tests in which the relative fluorescence quantum yields of films cured in air or cured in an inert atmosphere were measured. For each cured test film for which a relative fluorescence quantum yield was determined, an uncured reference film was prepared and evaluated in tandem with the test film. Optical densities for the cured test films and the corresponding uncured reference films were measured. The photoluminescence of the cured test films and the uncured reference films were measured on a commercial fluorescence spectrometer (Edinburgh Instruments FLS 920). The excitation wavelength was 380 nm and the fluorescence intensity of the film sample was determined. Care was taken to ensure that for a given set of samples, the sample alignment was preserved, so that the relative fluorescence intensity of each sample could be compared. From the optical density measured at 380 nm, the total fraction of the incident radiation absorbed by the film ($f_{abs}$) was calculated as in Equation (I).

$$f_{abs} = 1 - 10^{-OD_{380}} \qquad \text{Equation (I)}$$

From $f_{abs}$, the fraction of absorbed photons, relative fluorescence quantum efficiency ($QE_{rel}$) was computed using the integrated total fluorescence signal (the fluorescence intensity) divided by $f_{abs}$ as in Equation (II).

$$QE_{rel} = \frac{FL\_intensity}{f_{abs}} \qquad \text{Equation (II)}$$

For a given test sample and spectrometer alignment, $QE_{rel}$ could be normalized against $QE_{rel}$ determined for the corresponding uncured reference sample. Such normalized—$QE_{rel}$ values are presented herein unless otherwise indicated.

Example 1 and Comparative Example-1

Effect Of UV Curing Under An Inert Atmosphere vs. Curing In Air: Film-glass slide combinations were prepared as described in the General Methodology section. The films comprised 15% by weight NORLAND 68 OPTICAL ADHESIVE and 85% by weight of an electroluminescent polymer, BP79, available through Sumitomo Chemical Co., and were cured by exposure to UV radiation under an atmosphere of either nitrogen (Example-1) or air (Comparative Example-1). UV irradiation was carried out at 365 nanometers (nm) with a Blak-Ray UVL-56 365 nm ultraviolet lamp having an intensity of about 3.8 mW/cm$^2$ at the 365 nm wavelength. The exposure time was about 45 seconds. The optical densities of the film-glass slide combinations of Example 1 and Comparative Example-1 were then measured. The film-glass slide combinations of Example-1 and Comparative Example-1 were then subjected to a m-xylene rinse as described in the General Methodology section and the post-rinse OD of each was then measured. The cured film-glass slide combination of Example-1, cured under an inert atmosphere, while showing a 90 percent loss in OD following the m-xylene rinse, indicated that at least a fraction of the initial film layer had been converted to an insoluble interpenetrating network polymer, and that further optimization was possible. In Comparative Example-1, the film-glass slide combination cured in air showed only 8% loss in OD following the m-xylene rinse, indicating that the initial film layer had been largely converted to an insoluble interpenetrating network polymer. As part of the present invention, it was shown, however, that films prepared by UV irradiation in air of a film layer comprising an electroactive polymer and an INP precursor material, can be expected to display a substantial and undesirable decrease in photoluminescent (PL) efficiency. Because, photoluminescent efficiency correlates strongly with the electroluminescent (EL) efficiency, it is believed that a loss in photoluminescent efficiency observed when a film layer comprising an electroactive polymer and a INP precursor material is irradiated with UV light in the presence of air, will correlate with a corresponding loss in the electroluminescent efficiency of a light emitting device comprising a such an air-cured film.

Comparative Examples-2-4

In a series of tests, see Comparative Examples-2-4 Table I, three film samples of a blue emissive electroluminescent polymer (BP79) were prepared as described in the General Methods section with the exception that no INP precursor material was employed. In Comparative Example-2 the film was not exposed to UV radiation. In Comparative Example-3 and Comparative Example-4 the films were irradiated with a UV lamp for 15 minutes under an atmosphere of nitrogen (Comparative Example-3) or air (Comparative Example-4). Test results are given in Table I.

TABLE I

| Entry | UV Cure Time | Cure atmosphere | Optical Density | $QE_{rel}$* |
|---|---|---|---|---|
| Comparative Example-2 | 0 minutes | — | 0.795 | 0.91 |
| Comparative Example-3 | 15 minutes | nitrogen | 0.794 | 1.000 |
| Comparative Example-4 | 15 minutes | air | 0.802 | 0.53 |

*normalized with respect to the value obtained in Comparative Example-3

The data illustrate the detrimental impact of exposure of the electroluminescent polymer to UV radiation in the presence of air on the fluorescence emission properties of the electroluminescent polymer. Thus, the relative florescence quantum efficiency ($QE_{rel}$) of the film sample cured in air (Comparative Example-4) was markedly lower than that observed for the uncured film sample (Comparative Example-2) and the film sample cured under an inert atmosphere (Comparative Example-3).

Example 2 and Comparative Examples 5-9

A series of film samples (Example 2 and Comparative Examples 5-9, Table II) was prepared as described in the General Methods section using a blue emissive electroluminescent polymer (BP79) and an INP precursor material, NORLAND 68 OPTICAL ADHESIVE. (The film samples were cured by irradiation with UV light for the indicated time periods under an atmosphere of nitrogen (inert atmosphere) or in air to form a film comprising an interpenetrating network polymer composition. The optical density and relative fluorescence quantum efficiency was measured for each film prepared.

TABLE II

| Entry | Wt. % INP precursor material* | UV Cure Time (minutes) | Cure atmosphere | Optical Density | $QE_{rel}$ |
|---|---|---|---|---|---|
| Example-2 | 15% | 0.75 | nitrogen | 0.497 | 0.722 |
| Comparative Example-5 | 5% | 0.75 | air | 0.688 | 0.652 |
| Comparative Example-6 | 15% | 0.75 | air | 0.497 | 0.559 |
| Comparative Example-7 | 15% | 3 | air | 0.501 | 0.359 |
| Comparative Example-8 | 15% | 15 | air | 0.65 | 0.148 |
| Comparative Example-9 | 30% | 0.75 | air | 0.328 | 0.535 |

*NORLAND 68 OPTICAL ADHESIVE. The balance of the material comprising the film was BP79, a blue light emissive electroluminescent polymer.

The data provided in Table II demonstrate that curing a film comprising an electroactive polymer and an INP precursor material in air results in a substantial decrease in the relative fluorescence quantum efficiency ($QE_{rel}$) of the film. The benefit of effecting curing of the INP precursor material-electroactive polymer film under an inert atmosphere is especially evident in a comparison of Example 2 with Comparative Examples 6-8 of Table II.

Examples 3-11

In another series of experiments (See Table III) the effect of the structure of the INP precursor material on relative fluorescence quantum yield and the robustness of the film comprising the interpenetrating network polymer composition, as measured by post-cure film solubility, was investigated. Films comprising an electroluminescent polymer, BP79, and an INP precursor material (NORLAND 68 OPTICAL ADHESIVE ("N-68") or SR-454) were prepared as described in the General Methods section. Each film was subjected to UV curing under an atmosphere of nitrogen. Film compositions, cure times, relative fluorescence quantum yields, and solubility data are presented in Table III below.

TABLE III

| Entry | INP precursor material | Wt. % INP precursor material* | UV Cure Time (minutes) | $QE_{rel}$ | Post-cure film solubilty |
|---|---|---|---|---|---|
| Example-3 | N-68 | 15 | 15 | 0.594 | 53 |
| Example-4 | N-68 | 15 | 3 | 0.622 | 42 |
| Example-5 | N-68 | 30 | 15 | 0.706 | 22 |
| Example-6 | N-68 | 30 | 3 | 0.706 | 15 |
| Example-7 | N-68 | 5 | 15 | 0.832 | 85 |
| Example-8 | SR-454 | 5 | 15 | 0.710 | 85 |
| Example-9 | SR-454 | 15 | 15 | 0.861 | 29 |
| Example-10 | SR-454 | 30 | 15 | 0.835 | 12 |
| Example-11 | SR-454 | 15 | 3 | 0.831 | 51 |

In Table III data are presented for post-cure film solubility and normalized relative fluorescence quantum efficiency. Post-cure film solubility was determined as described herein. For example, a value of post-cure film solubility of 53 means that 53% of the material in the cured film sample was soluble in a m-xylene rinse test performed as described in the General Methods section. The data presented in Table III indicate that the SR-454 INP precursor material is more effective in preserving the photoluminescent (PL) efficiency of the electroactive polymer in the film layer comprising the interpenetrating network polymer composition than is the INP precursor material NORLAND 68 OPTICAL ADHESIVE (N-68). This is supported by a statistical analysis of the post-cure film photoluminescence data (excluding the films of Example 7 and Example 8, which remained very soluble (85% dissolution) even after curing.

Comparative Example-9 and Examples 12-14

A series of films was prepared as described in the General Methods section to study the effect of the ratio of electroactive polymer to INP precursor material on film robustness following curing. A Blak-Ray UVL-56 UV lamp with an intensity of about 3.8 mW/cm at 365 nm was used for curing and the exposure time was 15 minutes. Data are gathered in Table IV. Films were prepared using the triacrylated SR-454 as the INP precursor material and BP79 as the electroactive polymer. The data reveal that under the cure conditions employed, the robustness of the cured film is a function of the weight percentage of INP precursor material in the mixture of electroactive polymer and INP precursor material used. Thus, the cured film of Example 12 prepared from a mixture comprising 30 percent by weight INP precursor material and 70 percent by weight electroactive polymer is substantially less soluble in the rinse test than the cured films of Examples 13 and 14 which were prepared from mixtures comprising INP precursor material and electroactive polymer containing less INP precursor material. Similar results were obtained with a variety of other INP precursor materials, in particular for SR-368D, SR-502, and NORLAND 68 OPTICAL ADHESIVE. In addition, a similar relationship between post-cure film solubility and the amount of INP precursor material employed was observed when a photoinitiator (e.g. 2% by weight Sartomer Sarcure 1130) was included in the mixture of the electroactive polymer and the INP precursor material used to prepare the film sample. Thus, films prepared using a mixture of an electroactive polymer with one the polyacrylated Sartomer monomers mentioned, and 2% Sartomer Sarcure 1130 photoinitiator showed similar OD losses as a function of the weight percentage of the polyacrylated Sartomer monomer present in the mixture used to form the film.

TABLE IV

Effect Of The Ratio Of Electroactive Polymer To INP Precursor Material

| Entry | INP precursor material | Wt. % INP precursor material* | Optical Density before rinse | Optical Density after rinse | Post-cure film solubilty |
|---|---|---|---|---|---|
| Comparative Example-9 | NONE | 0% | 0.814 | 0.029 | 96% |
| Example-12 | SR454 | 30% | 0.352 | 0.310 | 12% |
| Example-13 | SR454 | 15% | 0.524 | 0.370 | 29% |
| Example-14 | SR454 | 5% | 0.710 | 0.095 | 87% |

*The balance of the material comprising the test film was the electroactive polymer BP79.

Comparative Examples 10-12 and Examples 15-19

The UV exposure time employed in film curing was found to have a significant effect on the insolubility of the cured film as is shown in Table V. The data show that for similarly constituted mixtures of electroactive polymer and INP precursor material, longer cure times provide cured films with enhanced structural integrity. Compare, for example Examples 15-17. Similar results were obtained for cured films prepared from mixtures of an electroactive polymer with either of the INP precursor materials SR368D or SR502. The results were similar when 2 weight percent Sarcure SR1130 photoinitiator was included in the mixture of electroactive polymer and INP precursor material used to prepare the films present as well. Cured films prepared with NORLAND 68 OPTICAL ADHESIVE, a material disclosed in its published Material Safety Data Sheet (prepared Nov. 21, 2005) to be a mixture of a proprietary mercapto-ester (45-65%) and tetrahydrofurfuryl methacrylate (5-20%) showed the same initial decrease in film solubility as the films prepared using the Sartomer monomers, but the post-cure solubility increased as the UV exposure times longer than about 1 minute. Several cured films (See Examples 18 and 19) were prepared using a low molecular weight electroactive polymer, ADS 145UV, a (poly[(9,9-dioctylfluorenyl-2,7-diyl)-co-(2, 5-p-xylene)]) available from American Dye Source, Inc. Cured films prepared with ADS145UV tended to have less structural integrity than cured films prepared using higher molecular weight electroactive polymers. ADS145UV is an electroactive polymer having a molecular weight in a range from about 10,000 to about 20,000 grams per mole, whereas BP79 is an electroactive polymer having a molecular weight greater than about 150,000 grams per mole.

The cured films prepared with ADS145UV were considered to display less structural integrity because of their greater solubility in the m-xylene rinse test. In Table V and elsewhere in this specification, cured films prepared using the method of the present invention consistently exhibit such enhanced structural integrity relative to cured films prepared by another method.

TABLE V

Effect of UV Curing Time on Cured Film Properties

| Entry | Electroactive polymer | Wt. % INP precursor material* | UV Cure time (min.) | Optical Density before rinse | Optical Density after rinse | Post-cure film solubilty |
|---|---|---|---|---|---|---|
| Comparative Example-10 | BP79 | 0 | 0 | 0.950 | 0.062 | 93** |
| Comparative Example-11 | BP79 | 0 | 15 | 0.954 | 0.136 | 86 |
| Comparative Example-12 | BP79 | 30 | 0 | 0.380 | 0.013 | 96** |
| Example-15 | BP79 | 30 | 0.75 | 0.368 | 0.312 | 15 |
| Example-16 | BP79 | 30 | 3 | 0.377 | 0.353 | 6 |
| Example-17 | BP79 | 30 | 15 | 0.375 | 0.364 | 3 |
| Example-18 | ADS145UV | 30 | 1 | 0.230 | 0.104 | 55 |
| Example-19 | ADS145UV | 30 | 24 | 0.231 | 0.213 | 11 |

*The balance of the material comprising the test film was the electroactive polymer (BP79 or ADS145UV)
**Represents the behavior of an uncured film.

Examples 20-23 and Comparative Example-13

The molecular weight of the electroactive polymer employed was found to have a significant effect on the structural integrity (e.g. the insolubility) of the cured film. This effect is illustrated by the data in Table VI. Cured films were prepared from mixtures comprising an electroactive polymer (70-85 weight percent) and an INP precursor material (15-30 relative weight percent). In Examples 20-23 the INP precursor material was SR454 acrylate and was employed in an amount corresponding to 30% by weight. In Comparative Example-13 the INP precursor material was also SR454 but was employed in an amount corresponding to 15% by weight. The films were cured by exposure for approximately 1 minute under argon or nitrogen to ultraviolet radiation from a filterless UVP model R-52G 254 nm source UV lamp having an estimated intensity of about 25 mW/cm$^2$ at 254 nm. The electroactive polymers employed, their molecular weights, and cured film solubility data are given in Table VI. "TFB" is an octylfluorene triarylamine electroactive copolymer available from the Sumation Company (Sumation KK). "155-8" is a lower molecular weight version of TFB which incorporates a cyclometallated iridium phosphor and was prepared as follows:

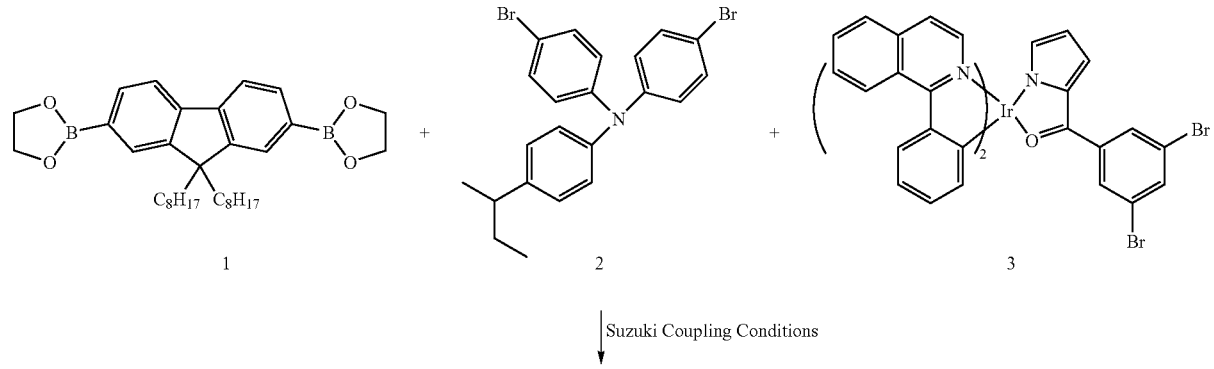

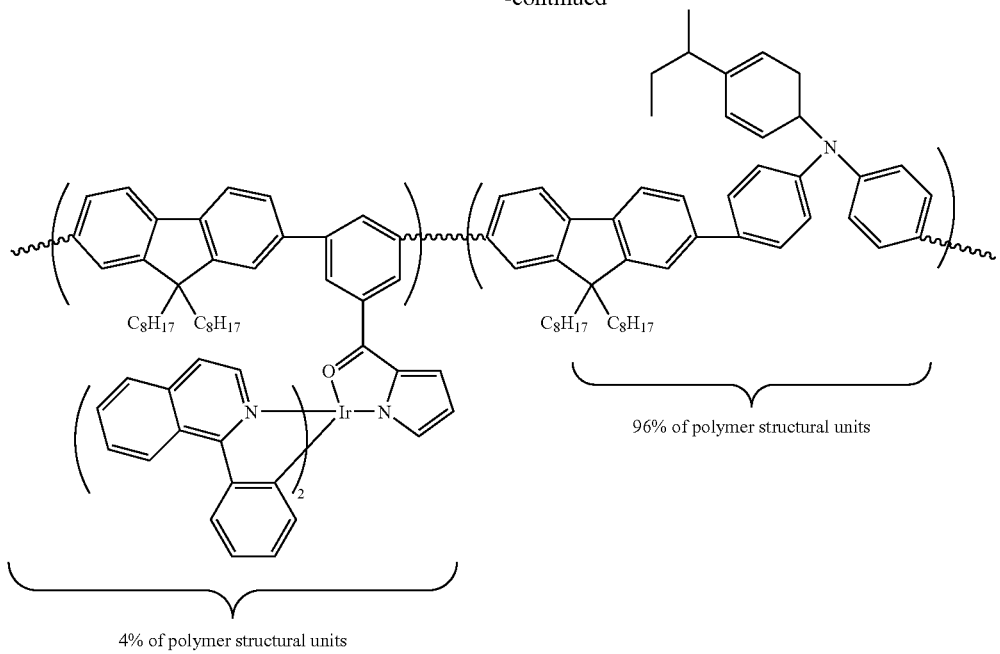

Preparation of Polymeric Organic Iridium Complex 155-8

A solution of bis-borate compound 1 (0.698 g, 1.300 mmol), triarylamine dibromide 2 (0.573 g, 1.248 mmol), iridium complex 3 (0.048 g, 0.052 mmol), and tris-o-tolylphosphine (0.0395 g, 0.13 mmol), in toluene (12 mL) was degassed with argon via an argon inlet tube for 15 minutes. $Pd(OAc)_2$ (3.4 mg, 0.015 mmol) and $Et_4NOH$ (1.0 mL of a degassed 20% aqueous solution, 1.36 mmol) were then added and degassing was continued for an additional 5 minutes. The reaction flask was then placed under a positive nitrogen pressure, immersed in an 80° C. oil bath and the reaction mixture was stirred at 80° C. for 18 hours. The reaction mixture then was diluted with toluene (10 mL) and stirred with 0.1N HCl (25 mL) for 30 minutes. This mixture was filtered through CELITE and the organic phase was washed with 2×25 mL of water and 1×25 mL of saturated NaCl. After filtration through layers of amine-functional silica gel and CELITE, the solution was concentrated to about 10% solids using a rotary evaporator. The residue was precipitated into methanol (5-10 volumes). Collected solids were redissolved in $CH_2Cl_2$ and reprecipitated into methanol. The collected solids were boiled with a water/methanol mixture (9/1), collected and stirred with acetone then methanol. The purified product polymer 155-8 was dried overnight in a vacuum oven at 60° C. The polymer was characterized by $^1$H-NMR spectroscopy and gel permeation chromatography. The product polymeric organic iridium complex had a weight average molecular weight of 48,680 grams per mole.

The data reveal a trend in which higher molecular weight electroactive polymers (See Examples 20-22) provide more robust cured films (e.g. more insoluble INPs) than lower molecular weight electroactive polymers (See Example-23). "ADS09HTM" (4,4',4"-tris(N,N-phenyl-3-methylphenylamino) triphenylamine) is an electroactive, non-polymeric, triarylamine. A cured film (Comparative Example-13) prepared using the non-polymeric electroactive material ADS09HTM showed relatively poor structural integrity (e.g. was highly soluble in the m-xylene rinse test).

TABLE VI

Effect Of Electroactive Polymer $M_w$ On Cured Film Structural Integrity

| Entry | Electroactive polymer | $M_w$* electroactive polymer | Wt % INP precursor material** | Optical Density before rinse | Optical Density after rinse | Post-cure film solubilty |
|---|---|---|---|---|---|---|
| Example-20 | BP79 | >150,000 | 30% | 0.368 | 0.312 | 14 |
| Example-21 | TFB | >150,000 | 30% | 0.339 | 0.316 | 7 |
| Example-22 | 155-8 | 48680 | 30% | 0.254 | 0.150 | 42 |
| Example-23 | ADS145UV | 10,000–20,000 | 30% | 0.230 | 0.104 | 55 |
| Comparative Example-13 | ADS09HTM | 789 | 15% | 0.196 | ~0.015 | 92 |

*Weight average molecular weight of in grams per mole (g/mol) as determined by gel permeation chromatography.

Examples 24-29

Cured films were prepared as described in the General Methods section from combinations of one or more of five INP precursor materials with an electroactive polymer selected from BP79 and ADS145UV. For films comprising BP79, curing was carried out using a Blak-Ray UVL-56 UV lamp with an intensity of 3.8 mW/cm$^2$ at 365 nm. Exposure time was 15 minutes. For films comprising ADS145UV, curing was carried out using a unfiltered UVP model R-52G 254 nm source UV lamp (estimated intensity of ~25 mW/cm$^2$ at 254 nm) and the exposure time was 1 minute. In each of Examples 24-29, the weight percentage of the INP precursor material in the uncured films was about 30% and the weight percentage of the electroactive polymer was about 70 percent. As noted, "SR295" is pentaerythritol tetraacrylate; "SR368D" is tris(2-hydroxyethyl) isocyanurate triacrylate; "SR454" is ethoxylated (3 mole) trimethylolpropane triacrylate; "SR502" is ethoxylated (9) trimethylolpropane triacrylate; and "CN975" is a hexafunctional urethane acrylate having a molecular weight of about 2000 grams per mole. Data are gathered in Table VII. The cured films prepared using the SR502 and CN975 INP precursor materials were shown to have less structural integrity than films prepared using the INP precursor materials SR454, SR368D, and SR295. No significant performance differences were observed as between SR454, SR368D, and SR295.

TABLE VII

| Entry | INP precursor material | Electroactive polymer | Wt % INP precursor material | Optical Density before rinse | Optical Density after rinse | Post-cure film solubility |
|---|---|---|---|---|---|---|
| Example-24 | SR368D | BP79 | 30% | 0.364 | 0.328 | 10 |
| Example-25 | SR502 | BP79 | 30% | 0.347 | 0.282 | 19 |
| Example-26 | SR454 | BP79 | 30% | 0.352 | 0.310 | 12 |
| Example-27 | SR454 | ADS145UV | 30% | 0.230 | 0.104 | 55 |
| Example-28 | SR295 | ADS145UV | 30% | 0.226 | 0.101 | 55 |
| Example-29 | 25% CN975 blended with 75% SR454 | ADS145UV | 30% | 0.235 | 0.092 | 61 |

Example 30

Preparation Of An OLED Device Fabricated According To The Method Of The Present Invention: A layer of PEDOT/PSS (Baytron P VP 8000, a poly(3,4-ethylenedioxythiophene)-poly(styrenesulfonate) obtained as a solution from HC Starck, Inc.) having a thickness of about 60 nm was deposited by spin-coating onto clean, UV-Ozone treated, 2.5 cm×2.5 cm ITO patterned glass substrates. The coated substrates were then baked on a hot plate in air for 30 minutes at 160° C. A layer of F8-TFB (an octylfluorene-triarylamine copolymer obtained from Sumation, Inc.) hole transporter layer having a thickness of about 10-20 nm was then spin-coated atop the PEDOT/PSS coated substrates. The F8-TFB-PEDOT/PSS coated substrates were then baked on a hot plate in argon for 30 minutes at 160° C. A layer comprised of the electroluminescent polymer BP79 blended with the INP precursor material SR454 acrylate (obtained from Sartomer, Inc.) was then spin-coated from a xylene solution atop the F8-TFB layer. The weight ratio of BP79 to SR454 acrylate was about 7:3. This layer on the F8-TFB-PEDOT/PSS coated substrates was cured by exposing it for 1 minute under argon to shortwave ultraviolet radiation from a UVP model R-52G 254 nm source UV lamp. The filter of the lamp had been removed and the substrates were positioned during curing at a distance of about 0.5 cm directly below the UV grid source. The intensity of the lamp was not calibrated but was estimated to be about 25 mW/cm$^2$ at the 254 nm wavelength believed necessary for curing the SR454 acrylate monomer. The estimated thickness of the cured layer was 40 nm. A final layer of BP157 (an electroluminescent polymer available from Sumation) was deposited by spin casting from a xylene solution of the electroluminescent polymer. Following evaporation of the xylene the final layer was a film having a thickness of about 40 nm. The last two deposited layers comprise a bilayer structure having enhanced structural integrity within the OLED device. The assembly was then placed in a bell jar evaporator, and the system was pumped until a pressure of about $1\times10^{-6}$ torr was obtained. A layer of sodium fluoride about 7 nm thick (as measured via a calibrated quartz crystal microbalance) was then deposited atop the final layer of the assembly by physical vapor deposition. Subsequently, a layer of aluminum metal about 130 nm thick was deposited atop the sodium fluoride layer by vapor deposition under vacuum to form the cathode component of the OLED.

Data on the performance of the OLED device prepared in Example 30 is given in Table VIII below. The color of light emitted by the OLED device was measured using a calibrated spectrometer while operating the device over a range of from about 390 nm to about 750 nm at a current density of about 1 mA. A qualitative assessment of the color is present in the rightmost column of Table VIII. For this qualitative assessment a device was considered "blue" if the integrated intensity in the region between 390 nm-550 nm>80% of the total intensity, "red" if the integrated intensity in the region 390 nm-550 nm was <15% of the total and "red-blue" for other devices. The luminous efficiency, Lumens per Watt (LPW), at the 1 mA current density is presented in Table VIII as well. For the LPW measurements the luminous output was measured using a silicon diode calibrated against a Minolta LS 100 luminance meter. To convert from cd/m$^2$ as measured on the luminance meter to lumens, a Lambertian emission pattern was assumed and the following equation was used. The electrical input was measured using a Keithley 237 Source measure unit.

$$\text{Lumens} = (cd/m^2) \times (\text{device area}) \times (\pi)$$

TABLE VIII

| | OLED Device Performance Characteristics | | | |
|---|---|---|---|---|
| Example | CIE X | CIE Y | LPW | Color of Emitted Light |
| Example 30 | 0.178 | 0.257 | 4.9 | Blue |

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

The invention claimed is:

1. A method of making an organic light-emitting device comprising at least one bilayer structure, said method comprising:
   providing a first layer comprising an electroactive material, and an INP precursor material;
   exposing the first layer while in contact with an inert atmosphere to a radiation source to afford a reacted first layer comprising an interpenetrating network polymer composition; and
   disposing at least one second layer on the reacted first layer to afford a bilayer structure.

2. The method according to claim 1, wherein said reacted first layer is a bipolar emission layer, a hole injection layer, an electron injection layer, an electron transport layer, a hole transport layer, exciton-hole transporting layer, exciton-electron transporting layer, a hole transporting emission layer, or an electron transporting emission layer.

3. The method according to claim 1, wherein said reacted first layer comprises an electroluminescent polymer.

4. The method according to claim 1, wherein said electroactive material is selected from the group consisting of poly(N-vinylcarbazole), polyfluorenes, poly(para-phenylenes), poly(p-phenylene vinylenes), poly(pyridine vinylenes), polyquinoxalines, polyquinolines, polysilanes, copolymers thereof, and combinations thereof.

5. The method according to claim 1, wherein said INP precursor material comprises a poly-acrylated compound, a poly-methacryalted compound, a poly-epoxide compound, a vinyl aromatic compound, a poly-carbamoylated compound, a polyvinyl ether compound, a trialkoxysilane, an organic orthosilicate, or a combination of two or more of the foregoing.

6. The method according to claim 1, wherein said INP precursor material comprises an acrylated INP precursor material.

7. The method according to claim 1, wherein said INP precursor material comprises a tri-acrylated compound having structure I

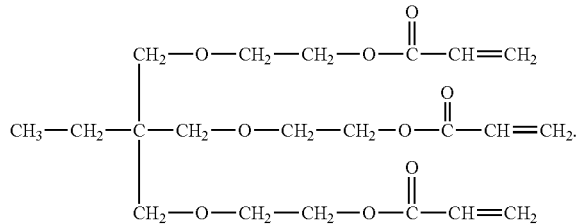

I

8. The method according to claim 1, wherein the first layer comprises the electroactive material in an amount corresponding to from about 0.1 to about 50 percent by weight based on a total weight of the first layer.

9. The method according to claim 1, wherein the first layer comprises the electroactive material in an amount corresponding to from about 5 to about 45 percent by weight based on a total weight of the first layer.

10. The method according to claim 1, wherein the first layer comprises the INP precursor material in an amount corresponding to from about 99.9 to about 10 percent by weight based on a total weight of the first layer.

11. The method according to claim 1, wherein said second layer is a bipolar emission layer, a hole injection layer, an electron injection layer, an electron transport layer, a hole transport layer, exciton-hole transporting layer, exciton-electron transporting layer, a hole transporting emission layer, or an electron transporting emission layer.

12. The method according to claim 1, wherein said reacted first layer comprises a polymeric organic iridium complex.

13. The method according to claim 1, wherein said radiation source is selected from the group consisting of visible light sources, ultra-violet light sources, gamma radiation sources, electron-beam sources, and combinations thereof.

14. The method according to claim 1, wherein said disposing of the second layer comprises solvent-casting, spin-coating, dip coating, spray coating, blade coating, or a combination thereof.

15. A bilayer structure prepared according to the method of claim 1.

16. An organic light-emitting device prepared according to the method of claim 1.

17. A method of making an organic light-emitting device comprising at least one bilayer structure, said method comprising:
   providing a first layer comprising an electroluminescent polymer, and an INP precursor material;
   exposing the first layer while in contact with an inert atmosphere to a radiation source to afford a reacted first layer comprising an interpenetrating network polymer composition; and
   disposing at least one second layer on the reacted first layer to afford a bilayer structure.

18. A method of making an organic light-emitting device comprising at least one bilayer structure, said method comprising:
   disposing a first layer comprising an electroactive material, and an INP precursor material onto a substrate comprising a first electrode;

exposing the first layer while in contact with an inert atmosphere to a radiation source to afford an a reacted first layer comprising an interpenetrating network polymer composition; and disposing at least one second layer on the reacted first layer to afford a bilayer structure; and disposing a second electrode on an assembly comprising the bilayer structure.

19. The method according to claim 16, wherein said first electrode comprises indium tin oxide.

20. The method according to claim 16, wherein said electroactive material is an electroluminescent polymer.

21. The method according to claim 16, wherein said INP precursor material comprises a poly-acrylated compound.

22. An organic light-emitting device prepared according to the method of claim 17.

* * * * *